US009330031B2

(12) United States Patent
Gupta

(10) Patent No.: US 9,330,031 B2
(45) Date of Patent: May 3, 2016

(54) SYSTEM AND METHOD FOR CALIBRATION OF SERIAL LINKS USING A SERIAL-TO-PARALLEL LOOPBACK

(75) Inventor: Alok Gupta, Fremont, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 52 days.

(21) Appl. No.: 13/316,386

(22) Filed: Dec. 9, 2011

(65) Prior Publication Data

US 2013/0151796 A1 Jun. 13, 2013

(51) Int. Cl.
*G06F 12/00* (2006.01)
*G06F 13/12* (2006.01)
*G06F 12/12* (2016.01)
*G11C 29/36* (2006.01)

(52) U.S. Cl.
CPC .............. *G06F 13/12* (2013.01); *G06F 12/12* (2013.01); *G11C 2029/3602* (2013.01)

(58) Field of Classification Search
USPC .............................. 711/154, E12.001; 710/71
See application file for complete search history.

(56) References Cited

U.S. PATENT DOCUMENTS

| | | | |
|---|---|---|---|
| 3,940,740 A | 2/1976 | Coontz | |
| 4,303,978 A * | 12/1981 | Shaw et al. | 701/506 |
| 4,541,075 A | 9/1985 | Dill et al. | |
| 4,621,366 A | 11/1986 | Cain et al. | |
| 4,773,044 A | 9/1988 | Sfarti et al. | |
| 4,885,703 A | 12/1989 | Deering | |
| 4,951,220 A | 8/1990 | Ramacher et al. | |
| 4,985,988 A | 1/1991 | Littlebury | |
| 5,036,473 A | 7/1991 | Butts et al. | |
| 5,125,011 A | 6/1992 | Fung | |
| 5,276,893 A | 1/1994 | Savaria | |
| 5,379,405 A | 1/1995 | Ostrowski | |
| 5,392,437 A | 2/1995 | Matter et al. | |
| 5,448,496 A | 9/1995 | Butts et al. | |
| 5,455,536 A | 10/1995 | Kono et al. | |
| 5,513,144 A | 4/1996 | O'Toole | |
| 5,513,354 A | 4/1996 | Dwork et al. | |
| 5,578,976 A | 11/1996 | Yao | |
| 5,630,171 A | 5/1997 | Chejlava, Jr. et al. | |
| 5,634,107 A | 5/1997 | Yumoto et al. | |
| 5,638,946 A | 6/1997 | Zavracky | |
| 5,671,376 A | 9/1997 | Bucher et al. | |
| 5,694,143 A | 12/1997 | Fielder et al. | |
| 5,705,938 A | 1/1998 | Kean | |

(Continued)

OTHER PUBLICATIONS

PCI SIG Debugging PCI Express 3.0 Link Problems—Dated Jun. 22, 2011; 50 Pages.

(Continued)

*Primary Examiner* — Mardochee Chery

(57) ABSTRACT

A system and method for calibration of serial links using serial-to-parallel loopback. Embodiments of the present invention are operable for calibrating serial links using parallel links thereby reducing the number of links that need calibration. The method includes sending serialized data over a serial interface and receiving parallel data via a parallel interface. The serialized data is looped back via the parallel interface. The method further includes comparing the parallel data and the serialized data for a match thereof and calibrating the serial interface by adjusting the sending of the serialized data until the comparing detects the match. The adjusting of the sending is operable to calibrate the sending of the serialized data over the serial interface.

20 Claims, 8 Drawing Sheets

(56) References Cited

U.S. PATENT DOCUMENTS

| | | |
|---|---|---|
| 5,766,979 A | 6/1998 | Budnaitis |
| 5,768,178 A | 6/1998 | McLaury |
| 5,805,833 A | 9/1998 | Verdun |
| 5,884,053 A | 3/1999 | Clouser et al. |
| 5,896,391 A | 4/1999 | Solheim et al. |
| 5,909,595 A | 6/1999 | Rosenthal et al. |
| 5,913,218 A | 6/1999 | Carney et al. |
| 5,937,173 A | 8/1999 | Olarig et al. |
| 5,956,252 A | 9/1999 | Lau et al. |
| 5,996,996 A | 12/1999 | Brunelle |
| 5,999,990 A | 12/1999 | Sharrit et al. |
| 6,003,083 A | 12/1999 | Davies et al. |
| 6,003,100 A | 12/1999 | Lee |
| 6,049,870 A | 4/2000 | Greaves |
| 6,065,131 A | 5/2000 | Andrews et al. |
| 6,067,262 A | 5/2000 | Irrinki et al. |
| 6,069,540 A | 5/2000 | Berenz et al. |
| 6,072,686 A | 6/2000 | Yarbrough |
| 6,085,269 A | 7/2000 | Chan et al. |
| 6,094,116 A | 7/2000 | Tai et al. |
| 6,219,628 B1 | 4/2001 | Kodosky et al. |
| 6,249,288 B1 | 6/2001 | Campbell |
| 6,255,849 B1 | 7/2001 | Mohan |
| 6,307,169 B1 | 10/2001 | Sun et al. |
| 6,323,699 B1 | 11/2001 | Quiet |
| 6,348,811 B1 | 2/2002 | Haycock et al. |
| 6,363,285 B1 | 3/2002 | Wey |
| 6,363,295 B1 | 3/2002 | Akram et al. |
| 6,366,968 B1 | 4/2002 | Hunsaker |
| 6,370,603 B1 | 4/2002 | Silverman et al. |
| 6,377,898 B1 | 4/2002 | Steffan et al. |
| 6,385,236 B1 * | 5/2002 | Chen .......................... 375/224 |
| 6,388,590 B1 | 5/2002 | Ng |
| 6,389,585 B1 | 5/2002 | Masleid et al. |
| 6,392,431 B1 | 5/2002 | Jones |
| 6,429,288 B1 | 8/2002 | Esswein et al. |
| 6,429,747 B2 | 8/2002 | Franck et al. |
| 6,433,657 B1 | 8/2002 | Chen |
| 6,437,657 B1 | 8/2002 | Jones |
| 6,486,425 B2 | 11/2002 | Seki |
| 6,504,841 B1 | 1/2003 | Larson et al. |
| 6,530,045 B1 | 3/2003 | Cooper et al. |
| 6,535,986 B1 | 3/2003 | Rosno et al. |
| 6,598,194 B1 | 7/2003 | Madge et al. |
| 6,629,181 B1 | 9/2003 | Alappat et al. |
| 6,662,133 B2 | 12/2003 | Engel et al. |
| 6,697,336 B1 | 2/2004 | Socher |
| 6,700,581 B2 | 3/2004 | Baldwin et al. |
| 6,701,466 B1 | 3/2004 | Fiedler |
| 6,717,474 B2 | 4/2004 | Chen et al. |
| 6,718,496 B1 | 4/2004 | Fukuhisa et al. |
| 6,734,770 B2 | 5/2004 | Aigner et al. |
| 6,738,856 B1 | 5/2004 | Milley et al. |
| 6,741,258 B1 | 5/2004 | Peck, Jr. et al. |
| 6,747,483 B2 | 6/2004 | To et al. |
| 6,782,587 B2 | 8/2004 | Reilly |
| 6,788,101 B1 | 9/2004 | Rahman |
| 6,794,101 B2 | 9/2004 | Liu et al. |
| 6,806,788 B1 | 10/2004 | Marumoto |
| 6,823,283 B2 | 11/2004 | Steger et al. |
| 6,825,847 B1 | 11/2004 | Molnar et al. |
| 6,849,924 B2 | 2/2005 | Allison et al. |
| 6,850,133 B2 | 2/2005 | Ma |
| 6,879,207 B1 | 4/2005 | Nickolls |
| 6,938,176 B1 | 8/2005 | Alben et al. |
| 6,956,579 B1 | 10/2005 | Diard et al. |
| 6,982,718 B2 | 1/2006 | Kilgard et al. |
| 7,020,598 B1 | 3/2006 | Jacobson |
| 7,058,738 B2 | 6/2006 | Stufflebeam, Jr. |
| 7,069,369 B2 | 6/2006 | Chou et al. |
| 7,069,458 B1 | 6/2006 | Sardi et al. |
| 7,075,542 B1 | 7/2006 | Leather |
| 7,075,797 B1 | 7/2006 | Leonard et al. |
| 7,085,824 B2 | 8/2006 | Forth et al. |
| 7,099,969 B2 | 8/2006 | McAfee et al. |
| 7,136,953 B1 | 11/2006 | Bisson et al. |
| 7,170,315 B2 | 1/2007 | Bakker et al. |
| 7,174,407 B2 | 2/2007 | Hou et al. |
| 7,174,411 B1 | 2/2007 | Ngai |
| 7,184,360 B2 * | 2/2007 | Gregorius et al. ......... 365/233.1 |
| 7,185,135 B1 | 2/2007 | Briggs et al. |
| 7,187,383 B2 | 3/2007 | Kent |
| 7,225,287 B2 | 5/2007 | Wooten |
| 7,246,274 B2 | 7/2007 | Kizer et al. |
| 7,260,007 B2 | 8/2007 | Jain et al. |
| RE39,898 E | 10/2007 | Nally et al. |
| 7,293,125 B2 | 11/2007 | McAfee et al. |
| 7,293,127 B2 | 11/2007 | Caruk |
| 7,305,571 B2 | 12/2007 | Cranford, Jr. et al. |
| 7,324,458 B2 | 1/2008 | Schoenborn et al. |
| 7,340,541 B2 | 3/2008 | Castro et al. |
| 7,363,417 B1 | 4/2008 | Ngai |
| 7,376,846 B2 | 5/2008 | Hawkins et al. |
| 7,383,412 B1 | 6/2008 | Diard |
| 7,398,336 B2 | 7/2008 | Feng et al. |
| 7,412,554 B2 | 8/2008 | Danilak |
| 7,415,551 B2 | 8/2008 | Pescatore |
| 7,424,564 B2 | 9/2008 | Mehta et al. |
| 7,461,195 B1 | 12/2008 | Woodral |
| 7,469,311 B1 | 12/2008 | Tsu et al. |
| 7,478,187 B2 | 1/2009 | Knepper et al. |
| 7,480,757 B2 | 1/2009 | Atherton et al. |
| 7,480,808 B2 | 1/2009 | Caruk et al. |
| 7,496,742 B2 | 2/2009 | Khatri et al. |
| 7,500,041 B2 | 3/2009 | Danilak |
| 7,505,461 B2 | 3/2009 | Matsuda et al. |
| 7,525,986 B2 | 4/2009 | Lee et al. |
| 7,536,490 B2 | 5/2009 | Mao |
| 7,539,801 B2 | 5/2009 | Xie et al. |
| 7,539,809 B2 | 5/2009 | Juenger |
| 7,562,174 B2 | 7/2009 | Danilak |
| 7,594,061 B2 | 9/2009 | Shen et al. |
| 7,600,112 B2 | 10/2009 | Khatri et al. |
| 7,617,348 B2 | 11/2009 | Danilak |
| 7,631,128 B1 | 12/2009 | Sgrosso et al. |
| 7,663,633 B1 | 2/2010 | Diamond et al. |
| 7,705,850 B1 | 4/2010 | Tsu |
| 7,715,323 B2 | 5/2010 | Connolly et al. |
| 7,756,123 B1 | 7/2010 | Huang et al. |
| 7,757,020 B2 | 7/2010 | Sharma et al. |
| 7,777,748 B2 | 8/2010 | Bakalash et al. |
| 7,782,325 B2 | 8/2010 | Gonzalez et al. |
| 7,788,439 B1 | 8/2010 | Tsu et al. |
| 7,793,029 B1 | 9/2010 | Parson et al. |
| 7,793,030 B2 | 9/2010 | Jenkins et al. |
| 7,849,235 B2 | 12/2010 | Ihara et al. |
| 7,853,731 B1 | 12/2010 | Zeng |
| 7,895,385 B2 | 2/2011 | Raju |
| 7,996,591 B2 | 8/2011 | Xie et al. |
| 8,006,008 B2 * | 8/2011 | Oliver .............................. 710/62 |
| 8,059,673 B2 | 11/2011 | Kobayashi |
| 8,132,015 B1 | 3/2012 | Wyatt |
| 8,275,922 B2 | 9/2012 | Barrett et al. |
| 8,301,813 B2 | 10/2012 | Barbiero et al. |
| 8,483,108 B2 | 7/2013 | Whitby-Strevens |
| 8,503,474 B2 | 8/2013 | Diab et al. |
| 8,532,098 B2 | 9/2013 | Reed et al. |
| 8,599,913 B1 | 12/2013 | Brown et al. |
| 8,687,639 B2 | 4/2014 | Kumar |
| 8,949,497 B2 | 2/2015 | Hopgood et al. |
| 9,176,909 B2 | 11/2015 | Diard et al. |
| 2003/0189977 A1 | 10/2003 | Sweitzer et al. |
| 2004/0201647 A1 | 10/2004 | Jackson Pulver et al. |
| 2004/0213361 A1 | 10/2004 | Chen et al. |
| 2005/0251595 A1 | 11/2005 | Lesartre |
| 2006/0114918 A1 | 6/2006 | Ikeda et al. |
| 2007/0011383 A1 | 1/2007 | Berke et al. |
| 2007/0050167 A1 * | 3/2007 | Johnson ........................ 702/117 |
| 2008/0072098 A1 | 3/2008 | Hunsaker et al. |
| 2009/0006708 A1 | 1/2009 | Lim |
| 2009/0086747 A1 | 4/2009 | Naven et al. |
| 2009/0254692 A1 | 10/2009 | Feehrer |
| 2010/0057973 A1 | 3/2010 | Barake et al. |
| 2010/0309918 A1 | 12/2010 | Kumar |

(56) References Cited

U.S. PATENT DOCUMENTS

| | | | |
|---|---|---|---|
| 2011/0255411 A1* | 10/2011 | Isaac et al. | 370/241 |
| 2011/0314458 A1 | 12/2011 | Zhu et al. | |
| 2012/0047260 A1 | 2/2012 | Patel | |
| 2012/0299756 A1* | 11/2012 | Chen et al. | 341/101 |
| 2013/0051483 A1 | 2/2013 | Wyatt et al. | |

OTHER PUBLICATIONS

"Battery Charging Specification", "USB Implementers Forum, Inc.", Dated: Mar. 8, 2007, pp. 1-29, Revision 1.0.

"Device Class Specification Adopters Agreement", Downloaded Circa: Mar. 10, 2007, pp. 1-5.

* cited by examiner

SYSTEM AND METHOD FOR CALIBRATION OF SERIAL LINKS USING A SERIAL-TO-PARALLEL LOOPBACK

FIELD OF THE INVENTION

Embodiments of the present invention are generally related to communication calibration.

BACKGROUND OF THE INVENTION

As computer systems have advanced, processing power and speed have increased substantially. Processors operate by executing software comprising a series of instructions for manipulating data in the performance of useful tasks. The instructions and associated data are stored in a memory. Demands increasingly call for faster and faster memory access. Unfortunately, increasing the speed on the interface between the memory controllers and the memory is becoming increasingly difficult.

For example, current memory controllers and DRAM (dynamic random-access memory) use a wide parallel address bus to send address information from the memory controller to the DRAM. For low-speed interfaces like sDDR (system Double data rate) memory, the interfaces between the memory controller and the DRAM run at a slow enough frequency such that training and calibration is not required. However, the use of a parallel bus requires use of numerous pins on both the memory controller and memory which is expensive. For example, a system using 16 bit addresses will use 16 pins for the address. Thus by design, parallel links allow guaranteeing that what is sent is captured correctly on the other end.

A serial bus allows use of fewer pins. For example, with an eight to one serialization ratio, a 16 bit address can be sent over two pins. Serial buses send the data faster than parallel busses because the same amount of data is sent over fewer pins for a given time period. As the serial interface operates at a higher speed, it is difficult to satisfy the timing budget of both the memory controller and the memory. Thus, training is required to capture data sent over a serial link.

In some conventional serial memory interfaces, a complete serial-to-serial loopback is used. A complete serial-to-serial loopback requires the loopback link to be calibrated and operational a priori so as to not introduce error in the looped back address data. Thus, a serial-to-serial loopback requires the loopback and serial address bus to each be calibrated with a loopback link calibrated a priori. In other words, two busses need to be calibrated before the interface can be operational.

Thus, while serial buses may be more efficient in terms of pin efficiency, serial buses require training to calibrate sending of data over the serial link.

SUMMARY OF THE INVENTION

Accordingly, what is needed is a communication solution to allow reduced usage of pins while minimizing the number of links that need a priori training before they can be operational. Embodiments of the present invention are operable for calibrating serial links using serial-to-parallel loopback configuration. Parallel loopback of serial data is used calibrate any electronic component to electronic component serial communication (e.g., memory controller, memory buffer, and memory). Further, embodiments of the present invention are operable for calibration of high speed serial links without having any link pretrained (e.g., links that are not trained or calibrated on power up) since lower frequency parallel readback is used to calibrate the high-speed serial link. Embodiments of the present invention are operable to train and calibrate single or multiple serial differential address links between a memory controller and a memory (e.g., DRAM).

In one embodiment, the present invention is directed toward a method for calibrating communication equipment. The method includes sending serialized data over a serial interface and receiving parallel data via a parallel interface. The parallel interface can be one or more uncalibrated serial data links. The serialized data is looped back via the parallel interface. The serial interface may be operable for sending an address to a memory component. The parallel interface may be operable for receiving data from a memory component. In one embodiment, the serial data is sent by a memory controller and the parallel data is received by the memory controller. The method further includes comparing the parallel data and the serialized data for a match thereof and calibrating the serial interface by adjusting the sending of the serialized data until said comparing detects the match. The adjusting of the sending is operable to calibrate the sending of the serialized data over the serial interface. The adjusting may comprise adjusting timing of the sending of the serialized data and/or adjusting framing of the serialized data. A determination may then be made of whether an additional serial link is operable for calibration. The method may further include sending a training mode signal to cause an electronic component to enter and exit a training mode for communication calibration.

In one embodiment, the present invention is implemented as a system for calibrating communication over a serial link. The system includes a serialization module operable for serializing data and transmitting serial data over the serial link and a parallel interface module operable for receiving data over a plurality of parallel links. In one embodiment, the serial link is an address link and each link of the plurality of parallel links is a data link. In one embodiment, the serialization module is operable for serializing address data. The serialization module and the parallel interface module may be coupled to a memory component (e.g., memory or memory buffer). The system further includes a comparison module operable for comparing serial data sent via the serialization module with parallel data received via the parallel interface module and a training module operable for configuring timing of transmission of data over the serial link based on results from the comparison module. In one embodiment, the training module is further operable to configure framing of transmission of data over the serial link.

In another embodiment, the present invention is directed to a communication system. The system includes a memory controller comprising a serial interface and a parallel interface. The memory controller is operable to send serialized data over the serial interface. The memory controller is further operable to configure framing and timing of data sent over the serial interface based on corresponding data received via the parallel interface. In one embodiment, the memory controller is further operable to periodically configure framing and timing of data sent over the serial interface. The system further includes a memory component (e.g., memory or memory buffer) coupled to the memory controller via the serial interface and the parallel interface. The memory component is operable to deserialize data received via the serial interface and operable to loopback the deserialized data via the parallel interface to the memory controller. In one embodiment, the serial interface is coupled to an address portion of the memory component and the parallel interface is coupled to a data portion of the memory component.

BRIEF DESCRIPTION OF THE DRAWINGS

Embodiments of the present invention are illustrated by way of example, and not by way of limitation, in the figures of the accompanying drawings and in which like reference numerals refer to similar elements.

DETAILED DESCRIPTION OF THE INVENTION

Figure 1:
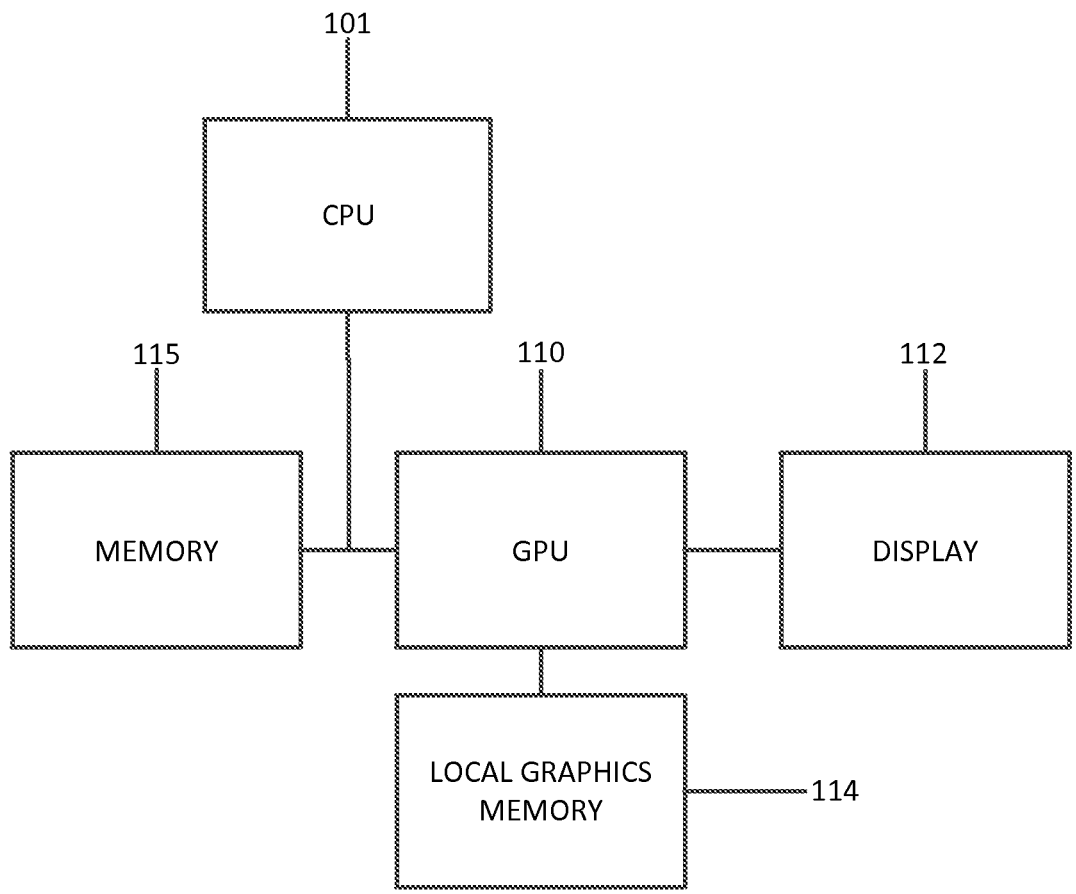
FIG. 1 shows a computer system in accordance with one embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Notation and Nomenclature:

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of an integrated circuit (e.g., computing system 100 of FIG. 1), or similar electronic computing device, that manipulates and transforms data represented as physical (electronic) quantities within the computer system's registers and memories into other data similarly represented as physical quantities within the computer system memories or registers or other such information storage, transmission or display devices.

Computer System Environment

FIG. 1 shows an exemplary computer system 100 in accordance with one embodiment of the present invention. Computer system 100 depicts the components of a generic computer system in accordance with embodiments of the present invention providing the execution platform for certain hardware-based and software-based functionality. In general, computer system 100 comprises at least one CPU 101, a system memory 115, and at least one graphics processor unit (GPU) 110. The CPU 101 can be coupled to the system memory 115 via a bridge component/memory controller (not shown) or can be directly coupled to the system memory 115 via a memory controller (not shown) internal to the CPU 101. The GPU 110 may be coupled to a display 112. One or more additional GPUs can optionally be coupled to system 100 to further increase its computational power. The GPU(s) 110 is coupled to the CPU 101 and the system memory 115. The GPU 110 can be implemented as a discrete component, a discrete graphics card designed to couple to the computer system 100 via a connector (e.g., AGP slot, PCI-Express slot, etc.), a discrete integrated circuit die (e.g., mounted directly on a motherboard), or as an integrated GPU included within the integrated circuit die of a computer system chipset component (not shown). Additionally, a local graphics memory 114 can be included for the GPU 110 for high bandwidth graphics data storage.

The CPU 101 and the GPU 110 can also be integrated into a single integrated circuit die and the CPU and GPU may share various resources, such as instruction logic, buffers, functional units and so on, or separate resources may be provided for graphics and general-purpose operations. The GPU may further be integrated into a core logic component. Accordingly, any or all the circuits and/or functionality described herein as being associated with the GPU 110 can also be implemented in, and performed by, a suitably equipped CPU 101. Additionally, while embodiments herein may make reference to a GPU, it should be noted that the described circuits and/or functionality can also be implemented and other types of processors (e.g., general purpose or other special-purpose coprocessors) or within a CPU.

System 100 can be implemented as, for example, a desktop computer system or server computer system having a powerful general-purpose CPU 101 coupled to a dedicated graphics rendering GPU 110. In such an embodiment, components can be included that add peripheral buses, specialized audio/video components, IO devices, and the like. Similarly, system 100 can be implemented as a handheld device (e.g., cellphone, etc.), direct broadcast satellite (DBS)/terrestrial set-top box or a set-top video game console device such as, for example, the Xbox®, available from Microsoft Corporation of Redmond, Wash., or the PlayStation3®, available from Sony Computer Entertainment Corporation of Tokyo, Japan.

System 100 can also be implemented as a "system on a chip", where the electronics (e.g., the components 101, 115, 110, 114, and the like) of a computing device are wholly contained within a single integrated circuit die. Examples include a hand-held instrument with a display, a car navigation system, a portable entertainment system, and the like.

Exemplary Systems and Methods for Calibration of Serial Differential Links Using Serial-to-Parallel Loopback Embodiments of the present invention are operable for calibrating serial links using serial-to-parallel loopback communication path. Parallel loopback of serial data is advantageously used to calibrate any component to component communication (e.g., memory controller, memory buffer, and memory). Further, embodiments of the present invention are operable for calibration of high speed serial links without the requirement of having any link working a priori (e.g., links that are not working on power up). In other words, the link does not need to be pretrained.

Embodiments of the present invention further support periodic calibration and thereby overcome variations such as drift that may occur with voltage and temperature changes. In one embodiment, the recalibration can be done during memory refresh when there is no traffic on the bus. For example, the recalibration can be done when the data bus and the command bus are idle at that point. Some systems may have natural idle times on the data bus and command bus which can be used for periodic training.

Figure 2:
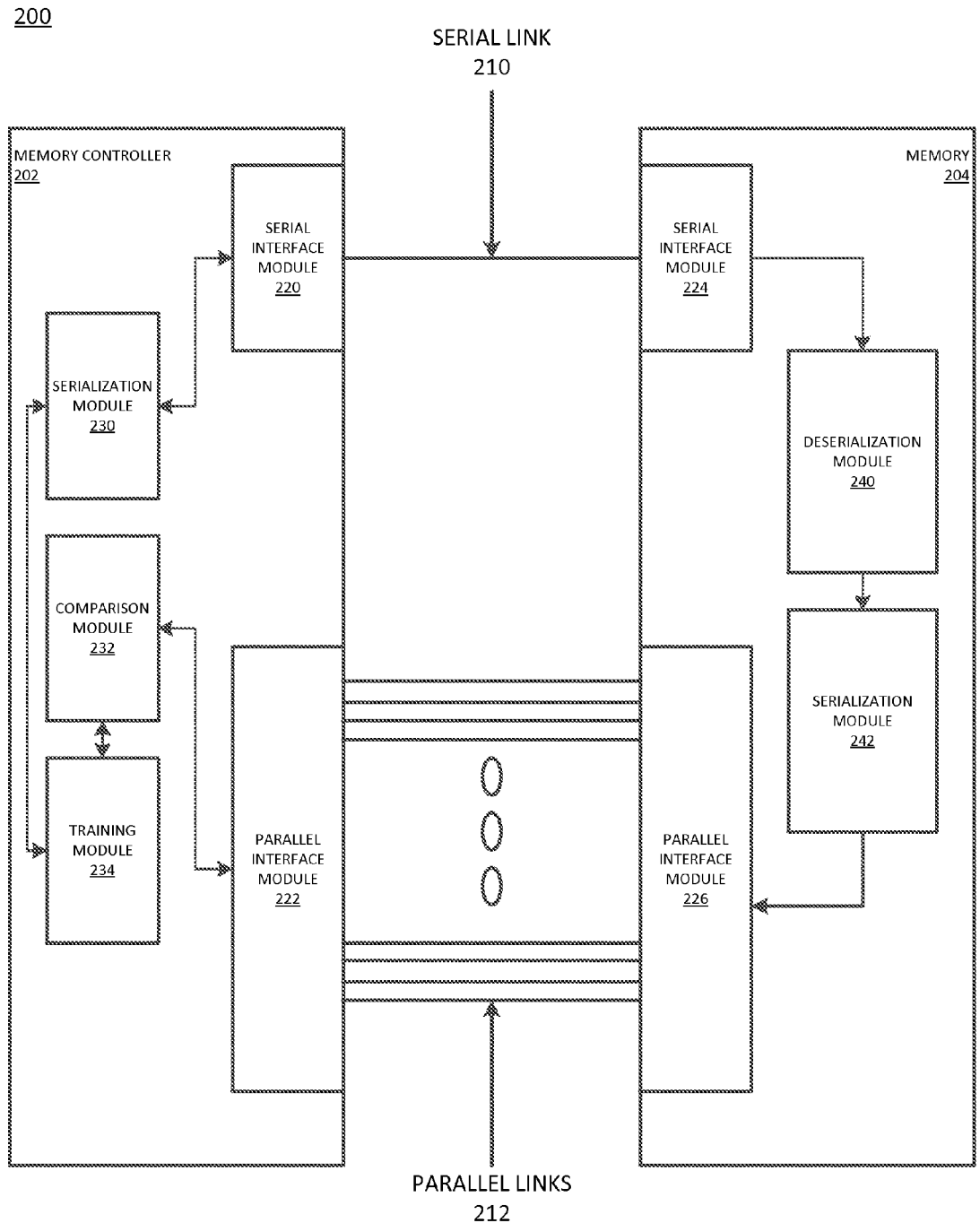
FIG. 2 shows a block diagram of exemplary components in accordance with one embodiment of the present invention.

FIG. 2 shows a block diagram of exemplary components, in accordance with an embodiment of the present invention. Diagram 200 includes memory controller 202 and memory 204. In one embodiment, memory controller 202 and memory 204 are coupled via serial link 210 and parallel links 212. FIG. 2 depicts an exemplary coupling of components for training or calibration of a serial link in accordance with embodiments of the present invention. Memory controller 202 may signal memory 204 to enter a training mode in which memory 204 loops back data received via serial link 210 via parallel links 212.

In one embodiment, serial bus or link 210 is an address bus and parallel links 212 are data links. The serial link may be a high speed link (e.g., 10 Gb/s, 16 Gb/s, 20 Gb/s, or greater). It is appreciated that a serial link is more power efficient than a set of parallel links because the serial link provides more bandwidth (e.g., 4x-5x) for the same amount of power used. Parallel links 212 do not have to be trained to be used. In one embodiment, the parallel loopback data links can be high speed serial links.

Memory controller 202 may have its own respective clock and memory 204 may have its own respective clock. The differences in each respective clock may give rise to timing and framing issues. For example, a bit sent to memory 204 from memory controller 202 as bit zero may be treated as bit two by memory 204 due to shifting caused by differences in the respective clocks. Embodiments of the present invention support training or calibration to overcome timing and framing issues.

For example, if memory controller 202 sends the sequence "1234" and receives a sequence of "34XX," where X is an incorrect bit, memory controller 202 can determine that the framing is off by two cycles. Memory controller 202 may then adjust the sending of the data to send the data two clock cycles earlier. For example, the sequence "1234" may now be sent two clock cycles earlier and "1234" will be received by memory controller 202 via parallel links 212.

Memory controller 202 is coupled to serial link 210 via serial interface module 220. Memory controller 202 is coupled to parallel links 212 via parallel interface module 222. Memory 204 is coupled to serial link 210 via serial interface module 224. Memory 204 is coupled to parallel links 212 via parallel interface module 226. In one embodiment, parallel links 212 are coupled to data pins of memory 204 and each pin is coupled to a multiplexer thereby enabling operation in a training mode and normal memory mode.

Memory controller 202 comprises serial interface module 220, parallel interface module 222, serialization module 230, comparison module 232, and training module 234. Serialization module 230 is operable for serializing data and transmitting serial data over serial link 210 (e.g., via serial interface module 220). Parallel interface module 222 is operable for receiving data over a plurality of parallel links (e.g., parallel links 212). Serialization module 230 and parallel interface module 222 may be coupled to a memory component (e.g., memory 204) or any electronic component.

Memory 204 includes serial interface module 224, parallel interface module 226, deserialization module 240, and serialization module 242. While in training mode, memory 204 receives data (e.g., an address) from memory controller 202 over serial link 210 via serial interface module 224. Serial interface module 224 sends the information to deserialization module 240. Deserialization module 240 deserializes the data and sends the data to serialization module which then sends out each bit of data out repeatedly in a serial manner over each respective link of parallel links 212 via parallel interface module 226. In other words, the serial data is converted into a low frequency parallel data stream that can easily be sampled and framed by the memory controller 202 (e.g., without training).

Memory controller 202 captures each bit sent over the "n" parallel data links of parallel links 212 and comparison module 232 compares the received bits against the bit pattern that was sent via serial interface module 220. Comparison module is operable 232 for comparing serial data sent via serialization module 220 with parallel data received via the parallel interface module 222. In one embodiment, a binary search and compare or similar algorithm may be used to identify and frame the loopback data from memory 204. In one embodiment, comparison module 232 is operable to take a majority vote for the bits received. In one embodiment, since each bit of the bit-stream are the same, memory controller 202 can deserialize the bit-stream and use a majority vote or similar algorithm to identify the incoming bit over each data link. For example, if the same five bits are received five out of seven times, then the correct bit may be determined based on a majority of the bits received to be the bit received five times. The replication of the data over parallel links 212 facilitates taking a majority vote of the bits received.

The results of the comparison by comparison module 232 are sent to training module 234. Training module 234 is operable for configuring timing of transmission and framing of data over the serial link. If no pattern is identified, training module 234 may adjust the address data transmit timing and send the data again. If a pattern is identified, training module 234 can further fine tune and sweep the timing window for an optimal value. Once an optimal phase is found, memory controller 202 can repeat sending for other serial links.

It is appreciated that the number of address bits and the number of parallel data links does not need to be equal. Since framing of serial data can be easily identified with initial "n" bits of the stream, embodiments of the present invention only need "n" parallel links for loopback. This allows embodiments of the present invention to be extensible for address links which have a higher serialization ratio than the number of available parallel loopback data links.

When each link is calibrated, memory controller 202 issues a command to end or exit the training mode of the DRAM. Embodiments of the present invention can be used to train multiple address links using simple logic functions (e.g., AND/OR/XOR/MUX) inside of memory (e.g., DRAM). In the case of multiple address links, memory controller 202 may send fixed data on links that are not being trained (e.g., all 0's for OR function) and training patterns on the link being trained. Due to the fixed function of DRAM, memory controller 202 may receive either training data as is or a logical function of training data back on the loopback path.

Figure 3:
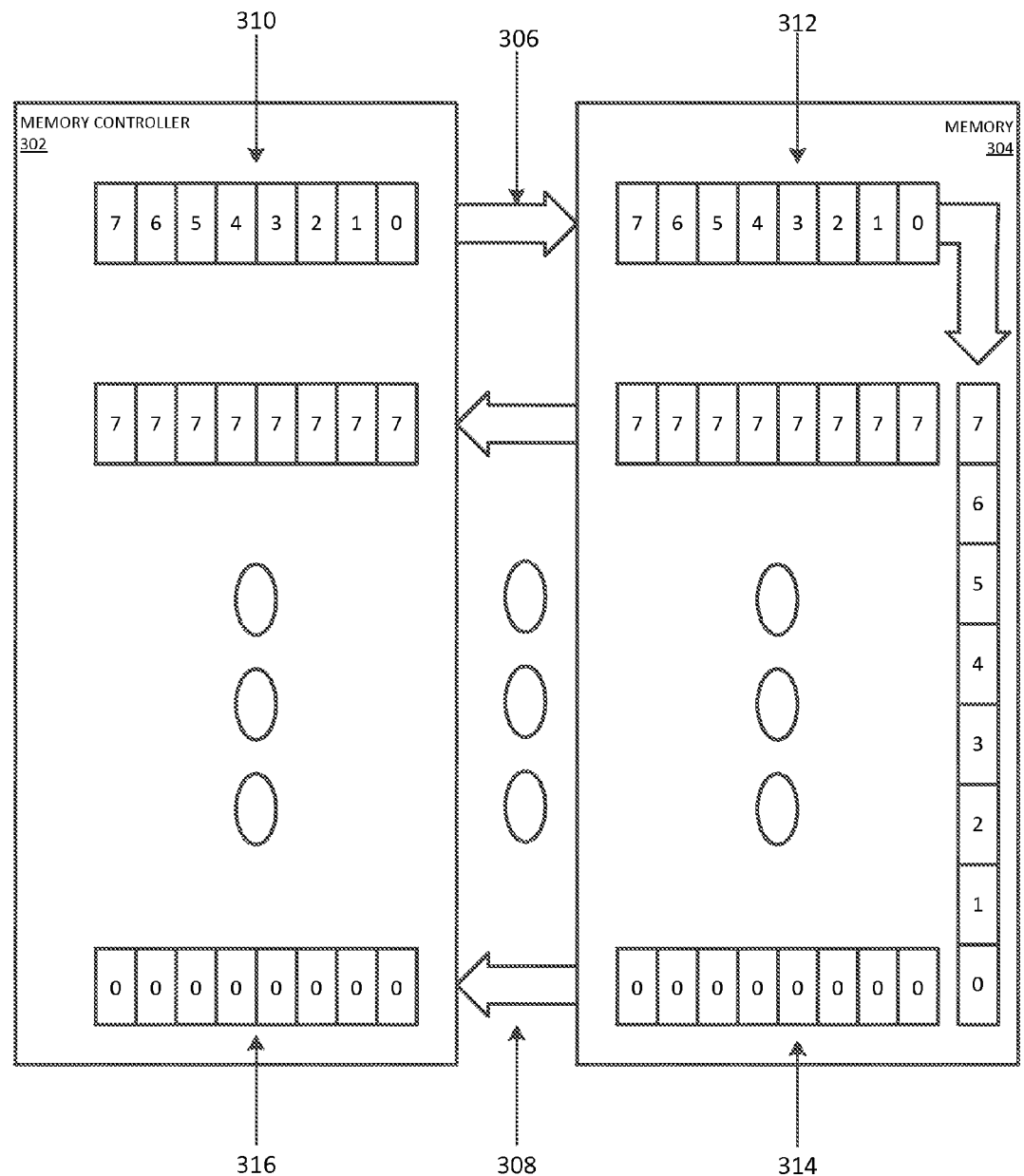
FIG. 3 shows a block diagram of an exemplary dataflow during training in accordance with one embodiment of the present invention.

FIG. 3 shows a block diagram of an exemplary dataflow during training in accordance with one embodiment of the present invention. Diagram 300 includes memory controller 302 and memory 304. FIG. 3 depicts a dataflow of an exemplary test sequence during training of a serial link.

Memory controller 302 sends exemplary data 310 (e.g., an address) over serial bus 306 to memory 304. In one embodiment, exemplary data 310 comprises 8 bits. Memory 304 receives exemplary data 301 as received sequence 312. Memory 304 then sends received sequence 312 as parallel sequence over 314 via parallel bus 308.

In one embodiment, serial bus 306 and parallel bus 308 operate at the same frequency. As a result, each bit of data received by memory 304 is sent back over each parallel link each time a bit is received over serial bus 306. In one embodiment, an address is sent over parallel bus 308 after each bit of the address is received. In other words, the memory receives bits over a high frequency serial bit and converts each bit into a low frequency bit so that memory controller 302 can receive it back replicated so that it looks like a parallel loopback.

As shown, each bit of exemplary data 310 is sent eight times over a respective parallel link of parallel bus 308 (e.g., bit '7' is sent eight times over a parallel link). More generally, "n"-bits of the captured address are sent back on the parallel bus 308. Bit-0 will be replicated "x" times to match the serialization of the data bus and sent back to memory controller 302 on parallel data bit-0. Bit-n is similarly serialized and sent back on data bit-n. This creates a low frequency loopback path whose frequency is 1/x of the serial data link speed. It is noted that not all bits of the captured address frame have to be transferred for the controller to detect correct framing. The number of loopback bits "n" may be equal to the number of loopback data paths available or the number of bits needed to correctly identify the address frame.

Based on a comparison of exemplary data 310 sent and received parallel data 316, memory controller 302 is operable to adjust timing and framing of data sent to memory 304 thereby calibrating communication over serial bus link 306.

Figure 4:
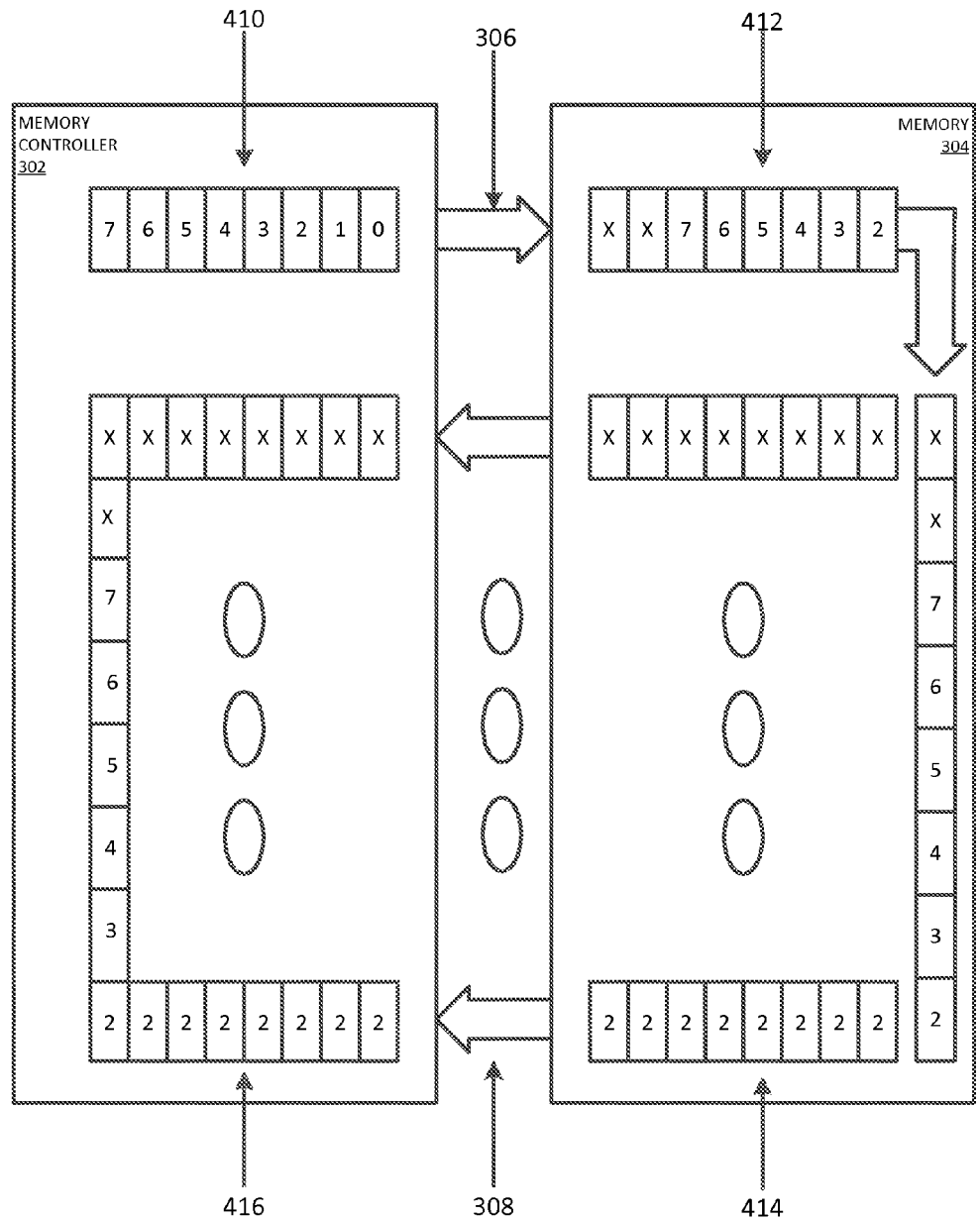
FIG. 4 shows a block diagram of an exemplary dataflow during training with the need for framing adjustment in accordance with one embodiment of the present invention.

FIG. 4 shows a block diagram of an exemplary dataflow during training with the need for adjustment in accordance with one embodiment of the present invention. Diagram 400 includes memory controller 302 and memory 304. FIG. 4 depicts when an address or data is not received accurately by over a serial link by a memory under a particular timing.

Exemplary data 410 is sent by memory controller 302 over serial link 306. Memory 304 receives the data via serial bus 306 as received sequence 412. Received sequence 412 comprises X, X, 7, 6, 5, 4, 3, and 2 which reflects that the first two bits (e.g., 0 and 1) were not captured because the timing and/or framing was off. Memory 304 then deserializes received sequence 412 and sends out parallel sequence 414 over parallel links 308. Memory controller 302 then receives the data on parallel links 308 as received parallel sequence 416. Memory controller 302 is then operable to determine that the first two bits were not received by memory 304 (e.g., bit indicated by an "X"). Memory controller 302 can then adjust the timing and/or framing of the sending of an address. For example, the timing may be adjusted to allow memory 304 to capture bits 0 and 1 or the frame may have bits 0-1-2-3-4-5 and the next frame will have bits 6-7. In one embodiment, the adjustments made by memory controller 302 may be done in a well known manner.

Figure 5:
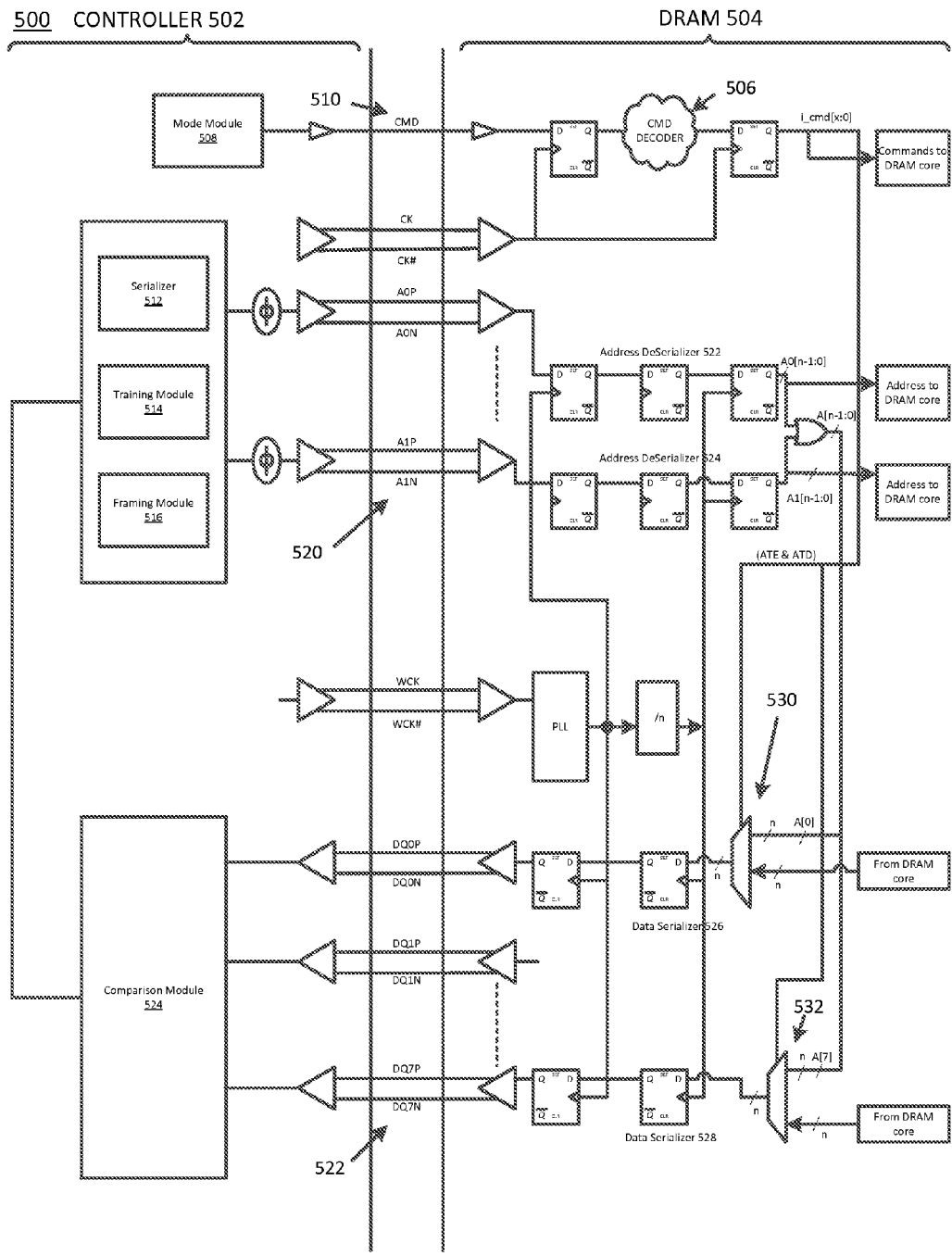
FIG. 5 shows an exemplary circuit diagram in accordance with one embodiment of the present invention.

FIG. 5 shows an exemplary circuit diagram in accordance with one embodiment of the present invention. Diagram 500 includes controller 502 (e.g., a memory controller) and Dynamic random-access memory (DRAM) 504. FIG. 5 depicts a circuit design for implementing calibration using serial-to-parallel loopback.

Controller 502 includes mode module 508, serializer 512, training module 514, framing module 516, and comparison module 524. Mode module 508 is operable for signaling DRAM 504 via command link or bus 510 to enter or exit a training mode. Mode module 508 can signal DRAM 504 to enter training mode for configuration or calibration of serial links 502. Mode module 508 can further signal DRAM 504 to exit training mode when transmission over serial links 502 has been calibrated (e.g., timing and framing configuration timing). In one embodiment, command bus 510 may be used to set the mode once and further training operations may be automated. Training commands may be decoded by command (CMD) decoder 506 and sent to a DRAM core of DRAM 504 which processes the command and configures DRAM 504 accordingly.

Serializer 512 is operable to send address data out over serial links 520. In one embodiment, serial links 520 include links A0P and A1P which are two address pairs for sending differential signals. For example, a pair of serial links may be used to each send 16 bits of a 32 bit address. Embodiments of the present invention support other configurations (e.g., 4 links used to send 8 bits each). The number of pairs may be equal to the number of bits that are to be sent divided by the serialization ratio.

Address deserializers 522 and 524 receive serial signals from serial links 520. Address deserializers 522 and 524 deserialize the signals and send the addresses to the DRAM core for processing. During training mode, the DRAM core 524 sends the addresses to data serializers 530 and 532 via multiplexers 530 and 532. In one embodiment, multiplexers 530 and 532 are controlled by a command line coming from command decoder 520 to select between training mode data and data from the DRAM core.

Data serializers 526 and 528 are operable to send the address data over parallel links 522 to comparison module 524 of controller 502. Comparison module 524 then provides comparison information to training module 514. Based on the comparison information, training module 514 determine whether timing and/or framing needs to be adjusted to calibrate transmissions over serial links 520. Training module 514 may signal framing module 516 to adjust framing of transmissions over serial links 520. Training module 514 may signal serialization module 512 to adjust timing of transmissions over serial links 520.

Figure 6:
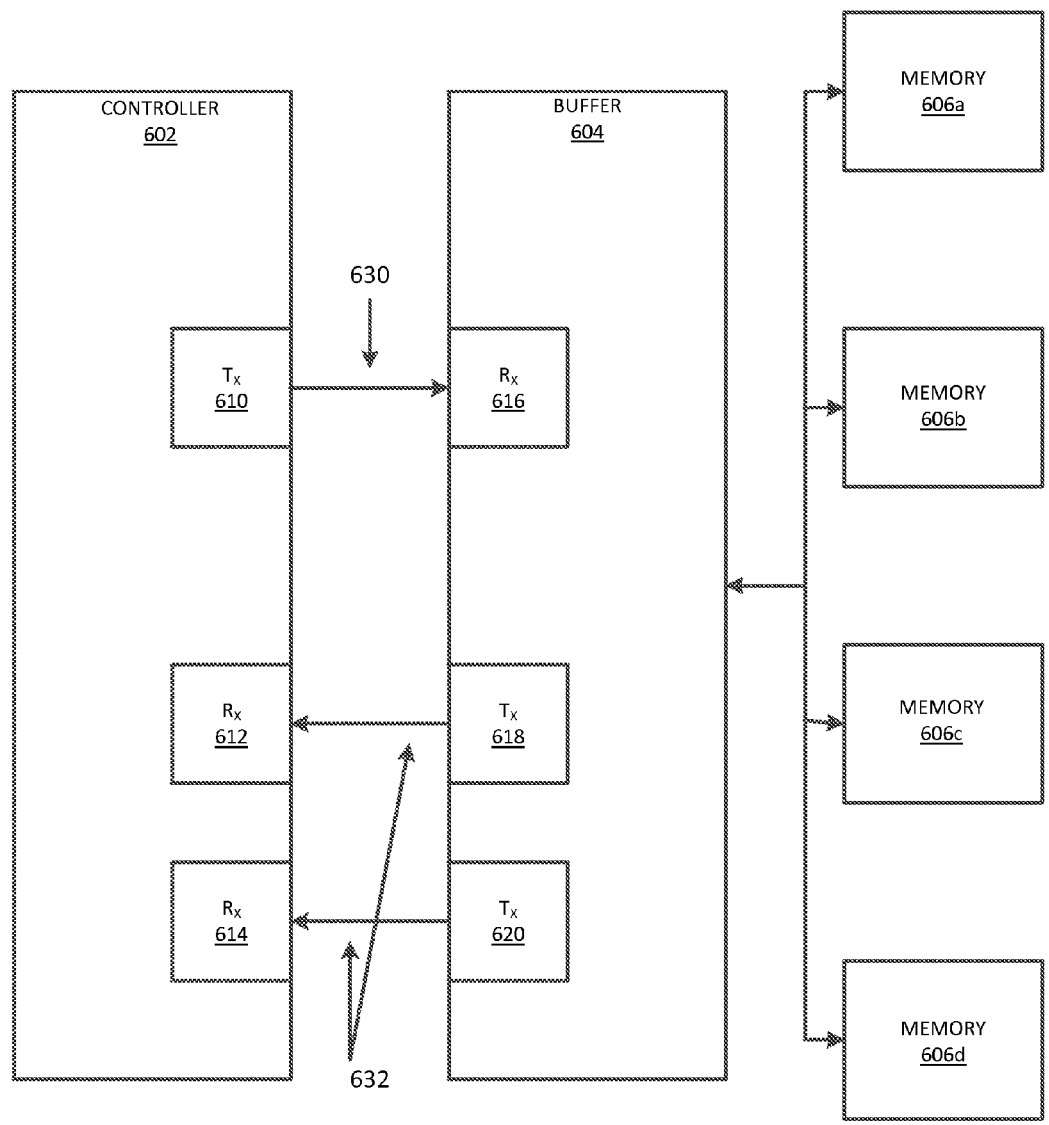
FIG. 6 shows a block diagram of exemplary memory configuration in accordance with one embodiment of the present invention.

FIG. 6 shows a block diagram of exemplary memory configuration in accordance with one embodiment of the present invention. Diagram 600 includes controller 602, buffer 604, and memories 606a-d. FIG. 6 depicts a coupling of receive and transmit interfaces and calibration of a serial link coupled to a memory buffer. Controller 602 is coupled to buffer 604 via serial link 630 and parallel links 632.

Embodiments of the present invention are also operable for use with memory buffers which use serial links. In one embodiment, the buffer 604 is coupled to controller 602 in front of memories 606a-d. A controller or other component may thus be directly coupled to the memory buffer. Buffer 604 may support aggregation of bandwidth over a plurality of links (e.g., to memories 606a-d). Embodiments of the present invention are further operable for use with multiple memory buffers which support aggregation of bandwidth over a plurality of links.

In one embodiment, controller 602 includes transmit interface 610 and receive interfaces 612-614. Buffer 604 includes receive interface 616 and transmit interfaces 618-620. Transmit interface 610 is coupled to receive interface 616 of buffer 604 via serial link 630. Transmit interfaces 616 and 620 are coupled to receive interfaces 612 and 614, respectively, of controller 602 via parallel links 632. Controller 602 can thus calibrate serial link 630 via loopback of data over parallel links 632 as described herein.

Figure 7:
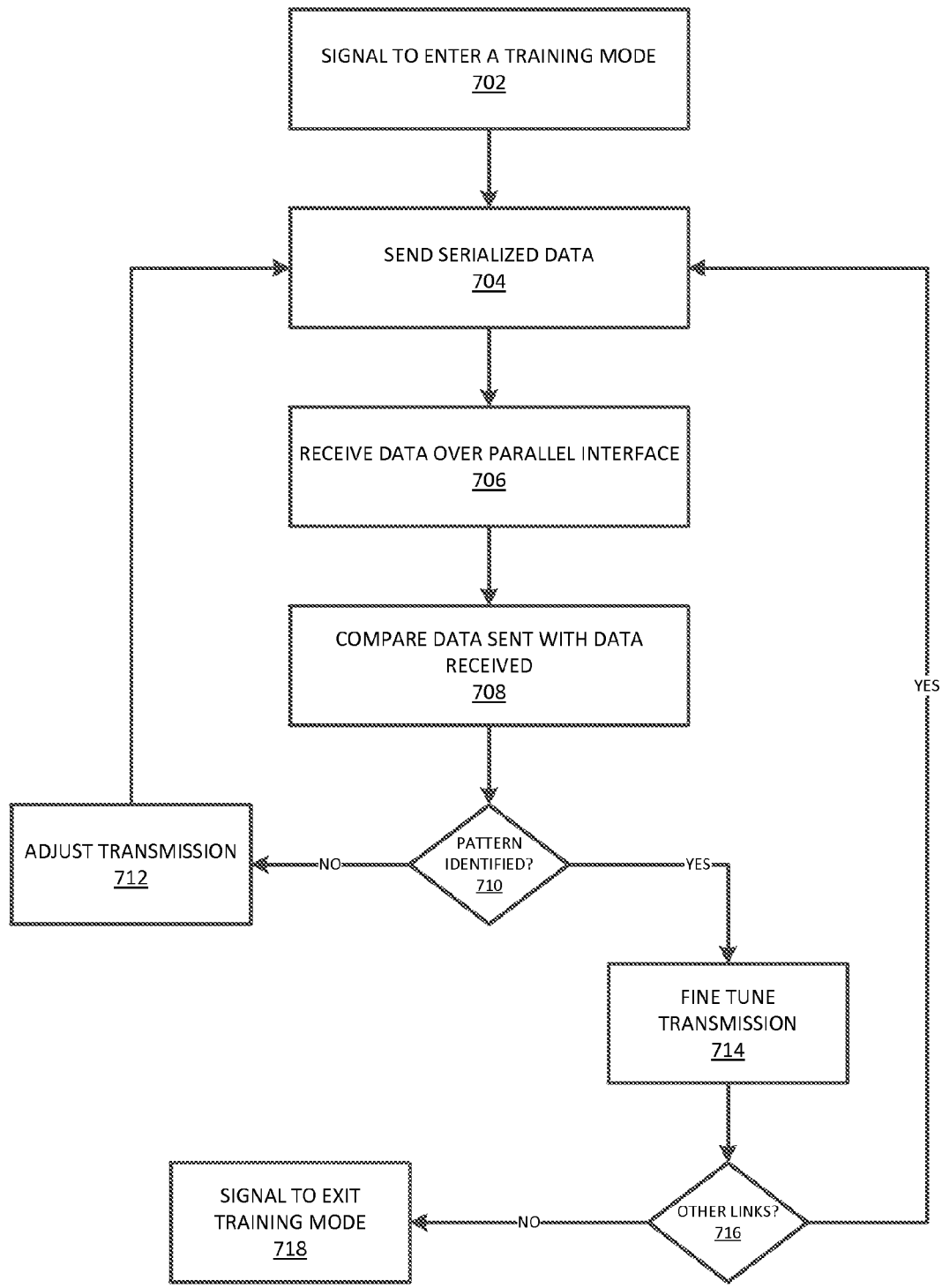
FIG. 7 shows a flowchart of an exemplary electronic component controlled process for training a serial interface in accordance with one embodiment of the present invention.
Figure 8:
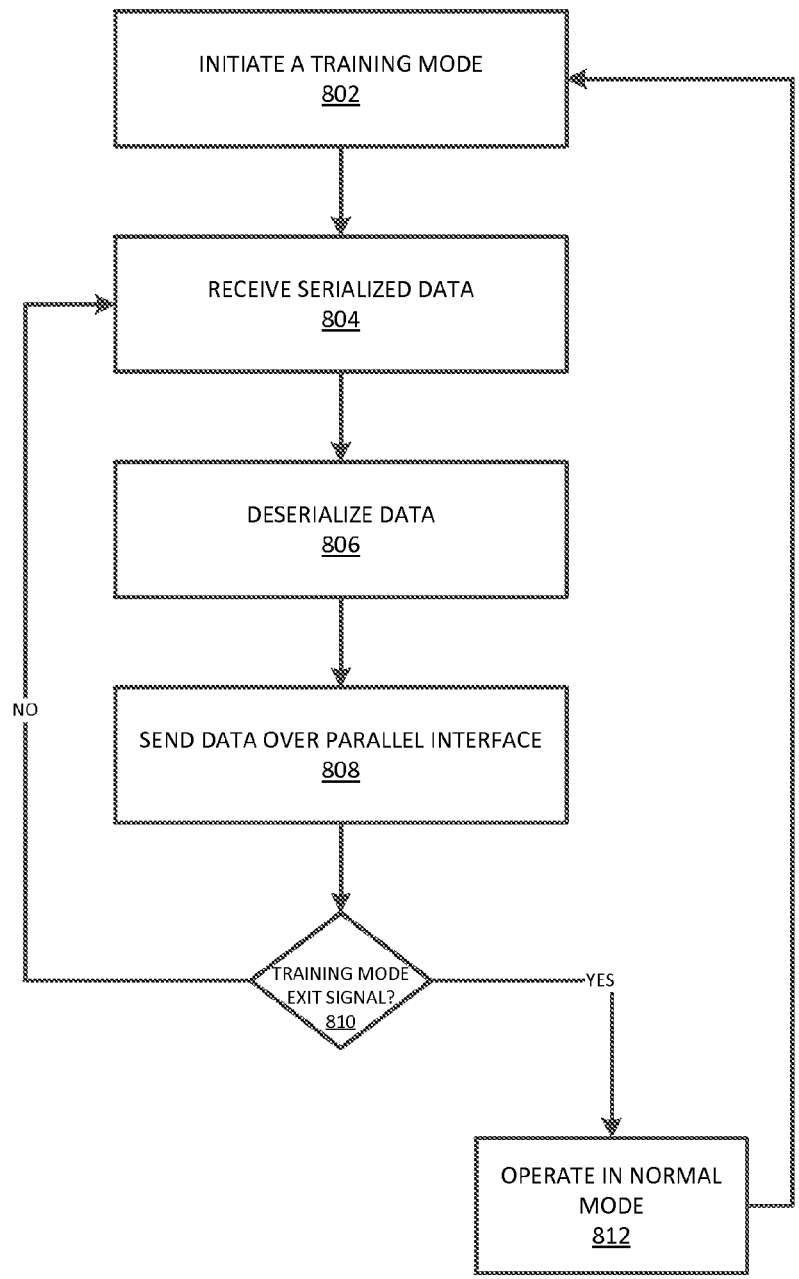
FIG. 8 shows a flowchart of an exemplary electronic component controlled process for receiving data and sending loopback data in accordance with one embodiment of the present invention.

With reference to FIGS. 7 and 8, flowcharts 700 and 800 illustrate example functions used by various embodiments of the present invention. Although specific function blocks ("blocks") are disclosed in flowcharts 700 and 800, such steps are examples. That is, embodiments are well suited to performing various other blocks or variations of the blocks recited in flowcharts 700 and 800. It is appreciated that the blocks in flowcharts 700 and 800 may be performed in an order different than presented, and that not all of the blocks in flowcharts 700 and 800 may be performed.

FIG. 7 shows a flowchart of an exemplary electronic component controlled process for training a serial interface in accordance with one embodiment. Flowchart 700 may be performed by a memory controller (e.g., memory controller 202).

At block 702, a training mode signal is sent. The training mode signal may be sent by a memory controller to cause a memory component (e.g., memory buffer or memory) to enter a training mode in which serial data is looped back over a plurality of parallel links.

At block 704, serialized data is sent over a serial interface. The serialized data may be test or calibration data that is to be looped back via a parallel interface by a memory component, as described herein. In one embodiment, the sending of the serialized data is performed by a memory controller.

At block 706, parallel data is received via a parallel interface. As described herein, serialized data previously sent may be looped back via the parallel interface to a memory controller. In one embodiment, the serial interface is operable for sending an address to a memory component and the parallel interface is operable for receiving data from a memory component.

At block 708, the parallel data and the serialized data are compared. At block 710, whether a pattern can be identified based on the comparison of the parallel data and the serialized data is determined. If a pattern is identified, block 714 is performed. If a pattern is not identified, block 712 is performed.

At block 712, in response to the comparing, the sending of the serialized data is adjusted. In one embodiment, the adjusting of the sending is operable to calibrate the sending of the serialized data over the serial interface. The adjusting may include timing and framing adjustments to calibrate communication over a serial link.

At block 714, the transmission via the serial interface is fine tuned. The fine tuning may include sweeping the timing window for an optimal value and adjusting communication accordingly.

At block 716, whether an additional serial link is operable for calibration is determined. Each serial link between two components (e.g., memory controller and memory) may be individually calibrated via parallel loopback as described herein. If there are additional serial links to be calibrated, block 704 is performed. If there are no additional serial links to be calibrated, block 718 is performed.

At block 718, a signal to exit training mode is sent. The signal to exit training mode may be sent via a command bus (e.g., command bus 510) to a memory component.

FIG. 8 shows a flowchart of an exemplary electronic component controlled process for receiving and sending data in accordance with one embodiment of the present invention. Flowchart 800 may be performed by a memory component (e.g., memory 202 or buffer 604).

At block 802, a training mode is initiated. The training mode may be initiated by a memory component in response to a command signal from a memory controller or other electronic component.

At block 804, serialized data is received. The serialized data may be received from a memory controller by a serial link.

At block 806, the data is deserialized. In one embodiment, the serialized data is deserialized by a memory component.

At block 808, the data is sent over a parallel interface. As described herein, a memory component sends back data received via a serial interface over parallel links via a parallel interface.

At block 810, whether a training mode exit signal has been received is determined. If a training mode exit signal has been received, block 812 is performed. If a training mode exit signal has not been received, block 804 is performed.

At block 812, normal memory component operations are performed. For example, a memory may operate to complete read and write requests from a memory controller. Block 802 may be performed on receiving a signal to enter a training mode (e.g., via a command bus).

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for calibrating communication, said method comprising:
   sending serialized data over a serial interface from a first location;
   receiving parallel data via a parallel interface from a second location, wherein said parallel data comprises a deserialized representation of said serialized data, wherein said parallel data is looped back to said first location via said parallel interface;
   comparing said parallel data received from said second location and said serialized data sent from said first location for a match thereof; and
   calibrating said serial interface by adjusting said sending of said serialized data until said comparing detects said match.

2. The method as described in claim 1 wherein said adjusting said sending comprising adjusting timing of said sending of said serialized data.

3. The method as described in claim 1 wherein said adjusting said sending comprising adjusting framing of said serialized data.

4. The method as described in claim 1 wherein a plurality of parallel links coupled to said parallel interface is uncalibrated and said serialized data is received via each of said parallel links at a frequency lower than a frequency of a serial link coupled to said serial interface.

5. The method as described in claim 1 wherein said serial interface is operable for sending an address to a memory component.

6. The method as described in claim 1 wherein said parallel interface is operable for receiving data from a memory component.

7. The method as described in claim 1 wherein said sending said serialized data and said receiving said parallel data are performed by a memory controller.

8. The method as described in claim 1 further comprising:
determining whether an additional serial link is operable for calibration.

9. A system for calibrating communication over a serial link, said system comprising:
a serialization module operable for serializing data and transmitting serial data over said serial link from a first location;
a parallel interface module operable for receiving parallel data over a plurality of parallel links from a second location, wherein said parallel data comprises a deserialized representation of said serial data;
a comparison module operable for comparing said serial data sent via said serialization module with said parallel data received via said parallel interface module; and
a training module operable for configuring timing of transmission of data over said serial link based on results from said comparison module.

10. The system as described in claim 9 wherein said training module is further operable to configure framing of transmission of data over said serial link.

11. The system as described in claim 9 wherein said serial link is an address link.

12. The system as described in claim 9 wherein each parallel link of said plurality of parallel links is a data link.

13. The system as described in claim 9 wherein said serialization module is operable for serializing address data.

14. The system as described in claim 9 wherein said serialization module and said parallel interface module are coupled to a memory component.

15. The system as described in claim 14 wherein said memory component is a memory buffer.

16. A system comprising:
a memory controller comprising a serial interface and a parallel interface, wherein said memory controller is operable to send serialized data from a first location over said serial interface, and wherein said memory controller is further operable to configure framing and timing of said serialized data sent over said serial interface based on corresponding parallel data received via said parallel interface from a second location; and
a memory component coupled to said memory controller via said serial interface and said parallel interface, wherein said memory component is operable to deserialize data received via said serial interface and operable to loopback said deserialized data via said parallel interface.

17. The system as described in claim 16 wherein said serial interface is coupled to an address portion of said memory component.

18. The system as described in claim 16 wherein said parallel interface is coupled to a data portion of said memory component.

19. The system as described in claim 16 wherein said memory component is a memory buffer.

20. The system as described in claim 16 wherein said memory controller is operable to periodically configure framing and timing of data sent over said serial interface.

\* \* \* \* \*